US011042786B2

(12) United States Patent
Masuzaki et al.

(10) Patent No.: US 11,042,786 B2
(45) Date of Patent: Jun. 22, 2021

(54) LEARNING PROCESSING DEVICE, DATA ANALYSIS DEVICE, ANALYTICAL PROCEDURE SELECTION METHOD, AND RECORDING MEDIUM

(71) Applicant: Mitsubishi Electric Corporation, Tokyo (JP)

(72) Inventors: Takahiko Masuzaki, Tokyo (JP); Osamu Nasu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/041,024

(22) PCT Filed: Mar. 30, 2018

(86) PCT No.: PCT/JP2018/013629
§ 371 (c)(1),
(2) Date: Sep. 24, 2020

(87) PCT Pub. No.: WO2019/187012
PCT Pub. Date: Oct. 3, 2019

(65) Prior Publication Data
US 2021/0049417 A1     Feb. 18, 2021

(51) Int. Cl.
*G06K 9/62*     (2006.01)
*G06N 20/00*    (2019.01)
*G01R 21/133*   (2006.01)

(52) U.S. Cl.
CPC ......... *G06K 9/6263* (2013.01); *G06K 9/6227* (2013.01); *G06N 20/00* (2019.01); *G01R 21/133* (2013.01)

(58) Field of Classification Search
CPC .. G06K 9/6263; G06K 9/6227; G01R 21/133; G06N 20/00
See application file for complete search history.

(56) References Cited

U.S. PATENT DOCUMENTS 7,636,697 B1 * 12/2009 Dobson ................. G06N 20/00
                                                          706/12
8,170,975 B1 *  5/2012 Qureshi ................ G06N 5/048
                                                          706/47
(Continued)

FOREIGN PATENT DOCUMENTS

JP       08-221117 A     8/1996
JP     2000-040079 A     2/2000
(Continued)

OTHER PUBLICATIONS

International Search Report and Written Opinion dated Jun. 12, 2018 for PCT/JP2018/013629 filed on Mar. 30, 2018, 8 pages including English Translation of the International Search Report.

(Continued)

*Primary Examiner* — Gregory M Desire
(74) *Attorney, Agent, or Firm* — Xsensus LLP

(57) ABSTRACT

An index outputter (120) of a learning processor (100) outputs an index for selection of an analysis procedure based on attributes of an analysis target. The attributes to be inputted include features of the analysis target itself and features of the environment surrounding the analysis target. The analysis procedure selector (170) selects an analysis procedure among analysis procedures as an analysis procedure for which diagnosis target data to be outputted by the analysis target is to be analyzed. The selected analysis procedure is a procedure in which an evaluation value of a property of data analysis satisfies a preset condition in connection with the index.

17 Claims, 19 Drawing Sheets

(56) References Cited

U.S. PATENT DOCUMENTS

| | | | |
|---|---|---|---|
| 10,204,153 B2* | 2/2019 | Morimoto | G06F 16/24578 |
| 2012/0209570 A1 | 8/2012 | Uchiyama et al. | |
| 2014/0132627 A1 | 5/2014 | Pompey et al. | |
| 2017/0193804 A1 | 7/2017 | Dong et al. | |
| 2020/0274894 A1* | 8/2020 | Argoeti | H04L 63/1408 |

FOREIGN PATENT DOCUMENTS

| | | |
|---|---|---|
| JP | 2007-116586 A | 5/2007 |
| JP | 2012-243013 A | 12/2012 |
| JP | 2016-029516 A | 3/2016 |
| TW | M548837 U | 9/2017 |
| WO | 2011/048661 A1 | 4/2011 |
| WO | 2017/168967 A1 | 10/2017 |

OTHER PUBLICATIONS

Decision to Grant a Patent received for Japanese Patent Application No. 2019-520752, dated Jul. 2, 2019, 5 pages including English Translation.

* cited by examiner

FIG.3A

WEIGTHING TABLE REGARDING USAGE DOMAINS (111)

| Usage domain | Analysis speed | Analysis accuracy | Analysis robustness |
|---|---|---|---|
| Normal factory | +5.0 | +7.0 | +4.5 |
| Precision machinery factory | +2.5 | +4.0 | +5.0 |
| Power generation facility | +2.0 | +4.0 | +5.0 |
| Power distribution facility | +7.0 | +2.0 | +1.0 |
| ⋮ | ⋮ | ⋮ | ⋮ |

FIG.3B

WEIGHTING TABLE REGARDING FACILITY DEVICE TYPES (112)

| Facility device type | Analysis speed | Analysis accuracy | Analysis robustness |
|---|---|---|---|
| Industrial robot | +7.0 | +2.0 | +1.5 |
| Laser machining machine | +5.0 | +4.0 | +3.0 |
| PUMP | −1.5 | −0.5 | +1.0 |
| ⋮ | ⋮ | ⋮ | ⋮ |

FIG.3C

113 WEIGHTING TABLE REGARDING INSTALLATION ENVIRONMENTS

| Installation environment | Analysis speed | Analysis accuracy | Analysis robustness |
|---|---|---|---|
| High temperature | 0.0 | +1.0 | +2.0 |
| Lower temperature | 0.0 | +1.0 | +1.0 |
| Sand | 0.0 | +1.0 | +1.0 |
| ⋮ | ⋮ | ⋮ | ⋮ |

FIG.3D

114 WEIGHTING TABLE REGARDING OPERATION POLICIES

| Operation policy | Analysis speed | Analysis quality | Analysis robustness |
|---|---|---|---|
| Place greater important on safety | +1.0 | +1.0 | +2.0 |
| Place greater importance on quality | 0.0 | +2.0 | +1.0 |
| Place greater importance on productivity | +2.0 | +1.0 | +0.0 |
| ⋮ | ⋮ | ⋮ | ⋮ |

FIG.4

Select a usage domain.

- ⊙ Normal factory
- ○ Precision machinery factory
- ○ Power generation facility
- ○ Power distribution facility
- ○ Keep usage domain unspecified

[Cancel] [Enter]

FIG.5

Select an installation environment and input a value (integer no greater than 1) indicating the degree regarding the selected installation environment.

- ☐ Indoors | 0.0
- ☐ Outdoors | 0.0
- ☑ High temperature | 0.8
- ☐ Low temperature | 0.0
- ☐ High humidity | 0.0
- ☑ Sand | 0.1
- ☐ Salt damage | 0.0

[Cancel] [Enter]

FIG.6

Select a facility device type.

⦿ Industrial robot

○ Laser machining machine

○ Pump

○ Keep facility device type unspecified

Cancel  Enter

FIG.7

PRE-PROCESSING TABLE

130

| Procedure | Evaluation value of analysis speed | Evaluation value of analysis accuracy | Path |
|---|---|---|---|
| Procedure11 | +8.0 | +3.0 | ... |
| Procedure12 | +9.5 | +2.7 | ... |
| Procedure13 | +6.0 | +3.1 | ... |
| Procedure14 | +5.5 | +4.0 | ... |
| Procedure15 | +5.0 | +4.5 | ... |

FIG.8

ANALYSIS PROCEDURE TABLE

140

| Procedure | Evaluation value of analysis speed | Evaluation value of analysis accuracy | Evaluation value of analysis robustness | Path |
|---|---|---|---|---|
| Procedure21 | +8.0 | +3.0 | +3.5 | ... |
| Procedure22 | +9.5 | +2.7 | +3.3 | ... |
| Procedure23 | +6.0 | +3.1 | +4.1 | ... |
| Procedure24 | +8.5 | +4.0 | +5.0 | ... |
| Procedure25 | +5.0 | +4.5 | +5.1 | ... |
| Procedure26 | +7.2 | +3.1 | +3.2 | ... |

FIG.10

The elements of the attributes of the analysis target inputted, the index values based on the attributes of the analysis target, and the selected analysis procedure are as indicated below.

If you accept the details below, press "Register". If you wish to reselect an analysis procedure, change the index values based on the attributes of the analysis target and then press "Reselect".

■ Usage domain: Unspecified

■ Facility device type: Industrial robot

■ Installation environment

High temperature  0.8

Sand  0.1

■ Operation policy:  Unspecified

☐ Index values based on attributes of the analysis target

Index value regarding analysis speed    [ +7.0 ]

Index value regarding analysis accuracy    [ +2.9 ]

Index value regarding analysis robustness    [ +3.2 ]

☐ Selected procedure and parameters

Procedure:  ···

Parameters:  ···

[ Reselect ]    [ Register ]

FIG.13

Select an operation policy.

○ Place greater importance on safety

○ Place greater importance on quality

○ Place greater importance on productivity

◉ Keep operation policy unspecified.

Decision

FIG.14

The inputted details are as follows. To reflect the inputted details, press the "Reflect" button. To cancel, press the "Cancel" button.

■Usage domain

Unspecified

■Facility device type

Industrial robot

■Installation environment

High temperature 0.8

Sand 0.1

■Operation policy

Unspecified

[ Cancel ] [ Reflect ]

FIG.17

Input details below regarding an analysis procedure to be added.

Analysis procedure name

Path

Index value regarding analysis speed

Index value regarding accuracy

Index value regarding robustness

Cancel     Register

FIG.18

Change the value of the weighting constant to be updated and then press the "Register" button.

WEIGHTING TABLE REGARDING USAGE DOMAINS

| Usage domain | Weighting constant of processing speed | Weighting constant of accuracy | Weighting constant of robustness |
|---|---|---|---|
| Precision machinery | +5.0 | +7.0 | +4.5 |
| Power generation | +2.5 | +4.0 | +5.0 |
| Power distribution | +2.0 | +4.0 | +5.0 |
| Residential devices | +7.0 | +2.0 | +1.0 |
| ⋮ | ⋮ | ⋮ | ⋮ |

Cancel  Register

LEARNING PROCESSING DEVICE, DATA ANALYSIS DEVICE, ANALYTICAL PROCEDURE SELECTION METHOD, AND RECORDING MEDIUM

CROSS-REFERENCE TO RELATED APPLICATION

The present application is based on PCT filing PCT/JP2018/013629, filed Mar. 30, 2018, the entire contents of which are incorporated herein by reference.

TECHNICAL FIELD

The present disclosure relates to a learning processing device, a data analysis device, an analysis procedure selection method, and an analysis procedure selection program.

BACKGROUND ART

In manufacturing systems, control systems, and the like, output data of control apparatuses, sensors, and the like are collected, and the collected data is analyzed in order to detect abnormality occurrences.

The performance required for data analysis differs depending on the field of the target system. For example, in the field of control of power generation and power distribution, it is crucial to promptly detect abnormalities due to the demand for high reliability. In the field of precision machine manufacturing, it is crucial to reliably detect abnormalities due to the demand for high accuracy. However, selecting an analysis procedure suited for a specific purpose among the multitude of analysis procedures is not an easy task.

Patent Literature 1 describes a system for presenting a user with analysis procedure candidates based on a history of past analysis processing accumulated in a database.

Patent Literature 2 describes a technique where the most accurate analysis procedure is adopted after executing multiple analysis procedures in parallel and then comparing the accuracy of the multiple analysis results.

CITATION LIST

Patent Literature

Patent Literature 1: Unexamined Japanese Patent Application Publication No. 2016-29516

Patent Literature 2: Unexamined Japanese Patent Application Publication No. 2000-40079

SUMMARY OF INVENTION

Technical Problem

Since the system described in Patent Literature 1 merely presents analysis procedure candidates, the user must choose an analysis procedure to be adopted from among the candidates presented to the user. Therefore, it is required for a user to possess specialized knowledge regarding analysis procedures and the target of the analysis. Moreover, attributes such as the characteristics of the analysis target and the environment surrounding the analysis target differ according differ from analysis target to analysis target. In order to select a suitable analysis procedure by taking into consideration the differences of the attributes it is required for the user to possess specialized knowledge. Using the system of Patent Literature 1 is not easy for a user who does not process specialized knowledge.

The data analysis device described in Patent Literature 2 executes multiple analysis procedures and adopts the analysis procedure that produced a result with the highest analysis accuracy. However, depending on the attributes of the analysis target, indicators such as processing speed must be prioritized in addition to the accuracy, so this device is unable to select an analysis procedure suited for the attributes of the analysis target.

In consideration of the aforementioned circumstances, an objective of the present disclosure is to select an analysis procedure suited for attributes of the analysis target and perform data analysis using the selected analysis procedure.

Solution to Problem

In order to achieve the aforementioned objective, index outputting means in a learning processing device of the present disclosure outputs an index for selection of an analysis procedure based on attributes of an analysis target. The attributes are to be inputted and include characteristics of the analysis target itself and characteristics of the environment surrounding the analysis target. Analysis procedure selection means selects an analysis procedure among analysis procedures, as an analysis procedure for which diagnosis target data to be outputted by the analysis target is to be analyzed. The selected analysis procedure being a procedure in which the evaluation value of a property of data analysis satisfies a preset condition in connection with the index.

Advantageous Effects of Invention

The learning processing device of the present disclosure outputs an index selection of an analysis procedure based on analysis target attributes that are to be inputted and include features of the analysis target itself and features of the environment surrounding the analysis target and then selects, an analysis procedure among analysis procedures, as an analysis procedure for which diagnosis target data to be outputted by the analysis target is to be analyzed. The selected analysis procedure is a procedure in which the evaluation value of a property of data analysis satisfies a preset condition in connection with the index. With such a configuration, the learning processing device of the present disclosure can select an analysis procedure that is suited for the attributes of the analysis target.

BRIEF DESCRIPTION OF DRAWINGS

FIG. 3A is a diagram illustrating an example of data to be registered into a weighting table regarding usage domains;

FIG. 3B is a diagram illustrating an example of data to be registered into a weighting table regarding facility device types;

FIG. 3C is a diagram illustrating an example of data to be registered into a weighting table regarding facility environments;

FIG. 3D is a diagram illustrating an example of data to be registered into a weighting table regarding operation policies;

FIG. 4 is a diagram illustrating an example of a selection screen of usage domains;

FIG. 5 is a diagram illustrating an example of a selection screen of installation environments;

FIG. 6 is a diagram illustrating an example of a selection screen of facility device types;

FIG. 7 is a diagram illustrating an example of data to be registered into a pre-processing table;

FIG. 8 is a diagram illustrating an example of data to be registered into an analysis procedure table;

FIG. 10 is a diagram illustrating an example of a screen on which a user inputs retrial instructions;

FIG. 13 is an illustration of an example of a selection screen of operation policies;

FIG. 14 is a diagram illustrating an example of a confirmation screen;

FIG. 17 is a diagram illustrating an example of a screen for adding an analysis procedure according to Modified Example 2; and FIG. 18 is a diagram illustrating an example of a screen for updating a weighting table according to Modified Example 2.

DESCRIPTION OF EMBODIMENTS

Embodiment

A data analysis device 1000 according to an embodiment of the present disclosure is a device for analyzing diagnosis target data collected from a facility device that is an analysis target. The data analysis device 1000 is a device that is a computer installed with a dedicated application. The data analysis device 1000 sets, as an analysis target, a facility device mounted with a component that is a target for abnormality detection. The data analysis device 1000 collects and analyzes data to be outputted from various apparatuses including programmable logic controllers, intelligent function units, and sensors installed on a facility device to be run in a production system, a control system, or the like.

The data analysis device 1000 selects an analysis procedure of data in accordance with the degrees of importance of properties of the data analysis based on attributes of a facility device to be analyzed (hereinafter, referred to as an analysis target), and analyzes the diagnosis target data by using the selected analysis procedure.

In the embodiment, the properties of data analysis are represented by: analysis speed indicating the speed of analysis processing, analysis accuracy indicating how close an analysis-based result is to a true value, and analysis robustness indicating resistance to change caused by external disturbances.

The attributes indicating environments, characteristics, and the like of an analysis target include a usage domain indicating the usage field of analysis target, a facility device type indicating a facility device that is to be the analysis target, an installation environment indicating an environment in which the analysis target is installed, and an operation policy of the system by which the analysis target runs.

Figure 1:
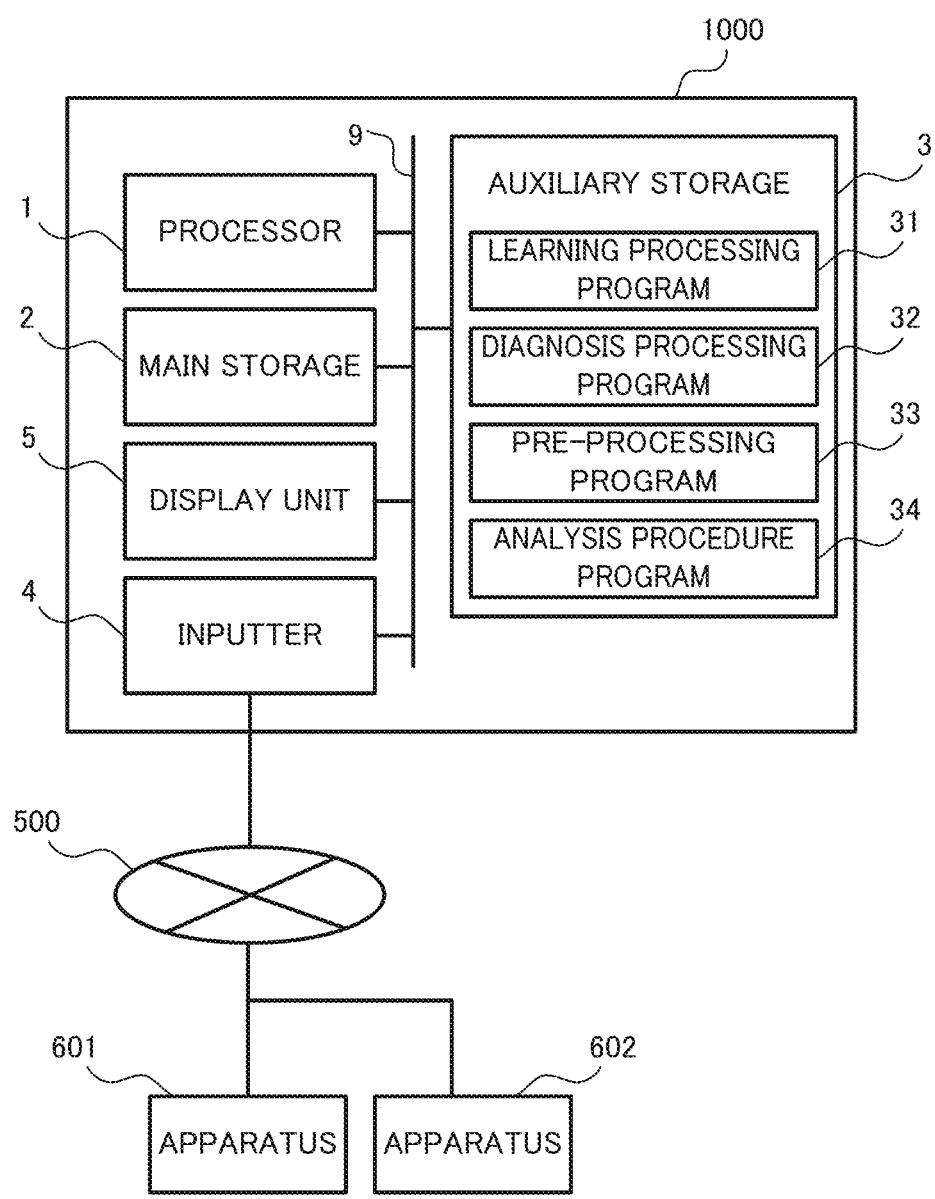
FIG. 1 is a block diagram illustrating a hardware configuration of a data analysis device according to an embodiment.

As illustrated in FIG. 1, the data analysis device 1000 includes, as the hardware configuration, a processor 1 that controls the entirety of the data analysis device 1000, a main storage 2 that is working memory of the processor 1, auxiliary storage 3 for storing various types of data, an inputter 4 that accepts input operations of a user and receives diagnosis target data, and a display unit 5 that outputs images to a display device. The main storage 2, the auxiliary storage 3, the inputter 4, and the display unit 5, all being connected to the processor 1 via a bus 9, communicate with the processor 1.

The processor 1 includes a central processing unit (CPU). The processor 1 accomplishes the various functions of the data analysis device 1000 by executing various types of programs stored in the auxiliary storage 3. Also, the processor 1 stores diagnosis target data received by the inputter 4 into the auxiliary storage 3 at the date and time acquired. The main storage 2 includes a volatile memory and is used as the working memory of the processor 1.

The auxiliary storage 3 includes a non-volatile memory. The auxiliary storage 3 stores programs and various types of data. The programs to be stored in the auxiliary storage 3 include a learning processing program 31 for learning processing that is executed by a learning processor 100, a diagnosis processing program 32 for diagnosis processing that is executed by a diagnosis processor 200, multiple pre-processing programs 33, and multiple analysis procedure programs 34, all of which are described further below. Also, the auxiliary storage 3 stores diagnosis target data. Also, the auxiliary storage 3 includes parameters to be specified when the analysis procedure is executed.

The inputter 4 includes components such as a keyboard, a mouse, and a touch panel. The inputter 4 accepts operation inputs from a user and outputs signals indicating the operation inputs made by the user to the processor 1. The inputter 4 also includes a network interface. The inputter 4 receives diagnosis target data from apparatuses 601 and 602 connected via a network 500, and outputs the received diagnosis target data to the processor 1. Examples of the apparatuses 601 and 602 include a programmable logic controller, an intelligent function unit, a sensor installed on a facility device, and the like. The display unit 5 includes components such as a display, a touch panel, and the like. The display unit 5 displays images based on signals provided by the processor 1.

Figure 2:
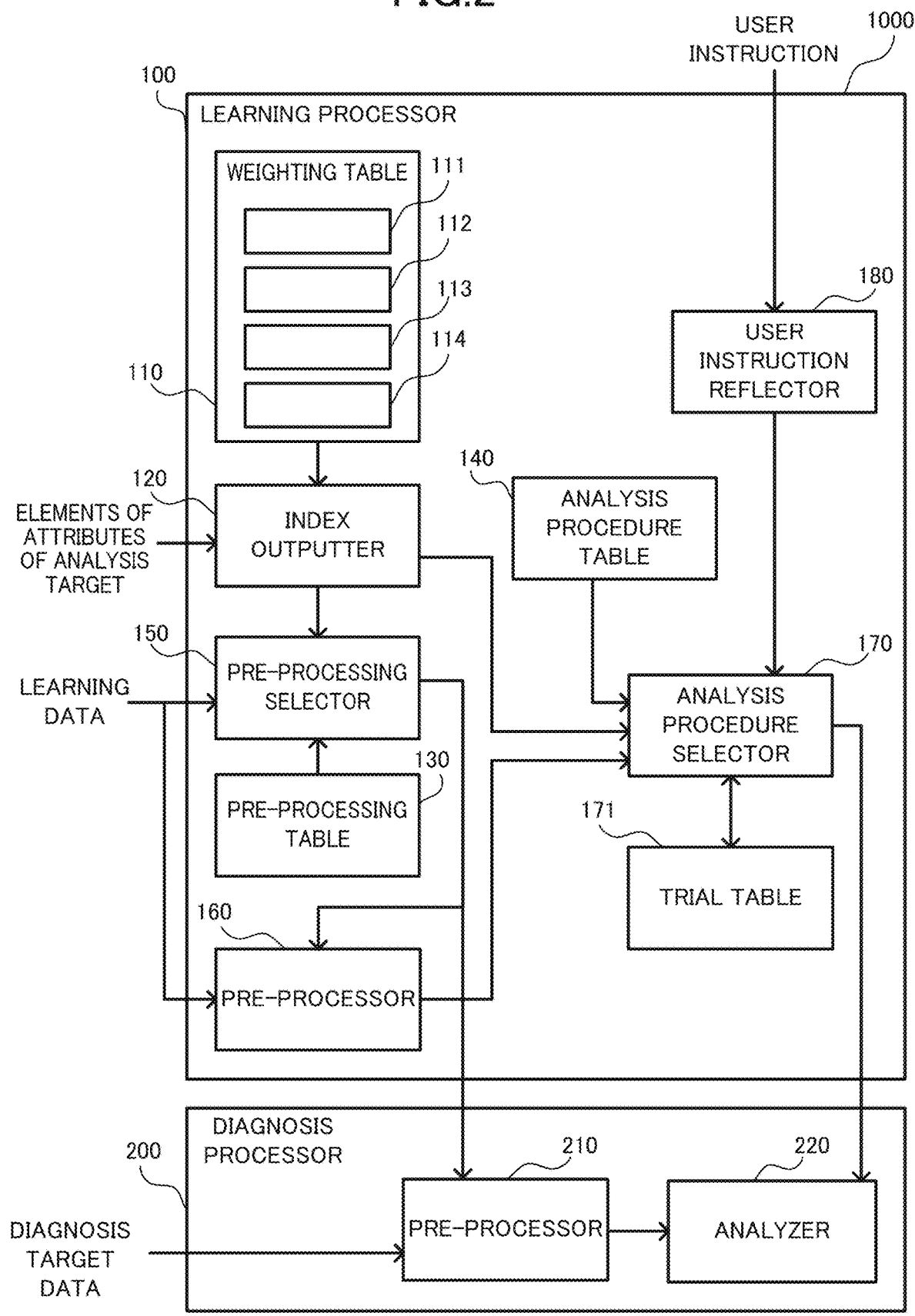
FIG. 2 is a functional block diagram of the data analysis device according to the embodiment.

As illustrated in FIG. 2, the data analysis device 1000 functionally includes the learning processor 100 that selects a suitable pre-processing and analysis procedure and the diagnosis processor 200 that analyzes the diagnosis target data by using the pre-processing and the analysis procedure selected by the learning processor 100. The learning processor 100 is an example of the learning processing device of the present disclosure.

The learning processor 100 obtains an index value for selection of an analysis procedure based on attributes of the analysis target, performs a trial with respect to the learning data, and selects a suitable analysis procedure based on the trial results and the index value. In the embodiment, the index value indicates which properties of the data analysis are to be regarded as important and which analysis procedure ought to be selected. More specifically, the index value indicates relative degrees of importance between the properties of the analysis speed, the analysis accuracy, and the analysis robustness in the selection of the analysis procedure. The learning data preferably is data similar to the diagnosis target data. Therefore, the learning processor 100 is provided with diagnosis target data that (i) is collected from the analysis target during a fixed period of time in the past and (ii) is stored in the auxiliary storage 3 as learning data.

The elements indicating the attributes of the analysis target to be inputted into the learning processor 100 by the user include information indicating the usage domain indicating the usage field of the analysis target, information indicating the type of facility device mounted with a component that is targeted for abnormality detection, information indicating an installation environment indicating an environment in which the facility device is installed, and information indicating an policy of operating a facility device.

The learning processor 100 includes weighting tables 110 in which the degrees of importance of elements of the attributes of the analysis target are defined, an index outputter 120 that obtains an index value indicating an index for selection of an analysis procedure, a pre-processing table 130 in which procedures of pre-processing that are targeted for selection are defined, an analysis procedure table 140 in which analysis procedures that are targeted for selection are defined, a pre-processing selector 150 that selects a pre-processing, a pre-processor 160 that performs pre-processing with respect to learning data and diagnosis target data before analysis processing is performed; an analysis procedure selector 170 that selects an analysis procedure based on an index value, and a user instruction reflector 180 that reflects an instruction of a user into the selection of analysis procedures.

The functions of the individual components of the learning processor 100 are accomplished by execution of the learning processing program 31 by the processor 1. The index outputter 120 is an example of the index outputting means of the present disclosure. The pre-processing selector 150 is an example of the pre-processing selection means of the present disclosure. The analysis procedure selector 170 is an example of the analysis procedure selection means of the present disclosure. The user instruction reflector 180 is an example of the user instruction reflection means of the present disclosure.

The weighting tables 110 are tables in which weighting constants indicating the degree of importance of each property of data analysis for each of the elements of attributes of the analysis target inputted into the learning processor 100 are defined.

There is a weighting table 110 for each attribute to be inputted. In the embodiment, as illustrated in FIGS. 3A to 3D, the weighting table 110 includes a weighting table 111 regarding usage domains, a weighting table 112 regarding facility device types, a weighting table 113 regarding installation environments, and a weighting table 114 regarding operation policies. The weighting constant of analysis speed, the weighting constant of analysis accuracy, and the weighting constant of analysis robustness associated with the respective elements of the attributes in the weighting tables 111 to 114 are defined.

For example, regarding the weighting constants of analysis speed in the weighting table 112 of FIG. 3B, the weighting constant of the "Industrial robot" is greater than the respective weighting constants of the "Laser machining machine" and the "Pump". This is indication that t in a case where the "Industrial robot" is selected as the analysis target, a greater high-speed analysis is required compared with a case where either the "Laser machining machine" or the "Pump" is the analysis target. Also, regarding the weighting constants of "Analysis accuracy", the weighting constant of the "Laser machining machine" is greater than the respective weighting constants of the "Industrial robot" and the "Pump", which are the remaining choices. This is indication that in a case where the "Laser machining machine" is selected, greater analysis accuracy is required compared with a case where the analysis target is either the "Industrial robot" or the "Pump".

Also, regarding the weighting constants of analysis robustness in the weighting table 113 of FIG. 3C, the weighting constant of "High temperature" is greater than the respective weight constants of "Low temperature" and "Sand". This is indication that in a case where "High temperature" is selected as the installation environment, greater analysis robustness is required compared with a case where the installation environment is either "Low temperature" or "Sand".

The index outputter 120 illustrated in FIG. 2 obtains an index value indicating an index for selecting an analysis procedure for analyzing diagnosis target data in accordance with elements of the inputted attribute, and outputs the obtained index value to the analysis procedure selector 170. For example, the index outputter 120 stores the obtained index value into the auxiliary storage 3. The index value stored in the auxiliary storage 3 is read by the analysis procedure selector 170. By doing so, the index outputter 120 provides the index value to the analysis procedure selector 170.

First, information to be inputted to the index outputter 120 is described as an element indicating an attribute of the analysis target. In a case where the usage domain indicating a usage field of the analysis target is to be specified as the attribute of the analysis target, the input value is, for example, a "Normal factory", a "Precision machinery factory", a "Power generation facility", or a "Power distribution facility". However, it is not necessary for the user to specify a usage domain as the attribute of the analysis target. In this case, it is assumed that there is no input regarding the usage domain in processing of the index outputter 120 which is described further below.

The index outputter 120 accepts an input regarding the usage domain from the user as follows. The index outputter 120 displays a screen such as that illustrated in FIG. 4 onto a display of the display unit 5. It is assumed that user selects the usage domain and presses the "Enter" button by using the keyboard, mouse, and/or the like of the inputter 4. In response to the operation of the user, the index outputter 120 stores a number indicating the selected usage domain and "1.0" as a value indicating that the usage domain is selected into a predetermined region of the auxiliary storage 3. Regarding a usage domain that is not selected, the index outputter 120 may store a number indicating the usage domain and "0.0" as a value indicating that the usage domain is not selected into the auxiliary storage 3.

In a case where a facility device type is to be specified as an attribute of the analysis target, the input value is, for example, the "Industrial robot", the "Laser machining machine", the "Injection molding machine", or the "Pump" as illustrated in FIG. 6. It is not necessary for the user to specify the facility device type. In this case, it is assumed that there is no input regarding the facility device type in the processing of the index outputter 120 which is described further below. The method for accepting an input regarding the facility device type from the user is similar to that which is used in the usage domain described above. In response to the input operation of the user, the index outputter 120 stores a number indicating the selected facility device type and "1.0" as an input value indicating that the facility device type is selected into a predetermined region of the auxiliary storage 3. Regarding a facility device type that is not selected, the index outputter 120 may store a number indicating the facility device type and "0.0" as a value indicating that the usage domain is not selected into the auxiliary storage 3.

In a case where an installation environment is to be specified as an attribute of the analysis target, the input value is, for example, "High temperature", "Low temperature", "Sand", "High humidity", "Low humidity", "Indoors", "Outdoors", and/or "Salt damage" as illustrated in FIG. 5. The term "Sand" indicates that there is lots of sand in the installation environment. The term "Salt damage" indicates that the installation environment is susceptible to salt damage on account of the installation environment being close ocean. It is not necessary for the user to specify even one installation environment. In this case, it is assumed that there is no input regarding the installation environment in the processing of the index outputter 120 which is described further below.

The user can select multiple choices regarding the installation environment. The index outputter 120 accepts an input from a user regarding the installation environment as follows. The index outputter 120 displays a screen such as that illustrated in FIG. 5 onto the display of the display unit 5. On the input screen of the installation environment, the user selects an installation environment, and inputs a value indicating a degree of the selected choice within a range from 0.0 to 1.0. In response to the operation of the user, the index outputter 120 stores a number indicating the selected installation environment and a numerical value indicating the inputted degree into a predetermined region of the auxiliary storage 3.

In a case where an operation policy is to be specified as an attribute of the analysis target, the input value, the input value is, for example, "Place greater importance on safety", "Place greater importance on quality", and/or "Place greater importance on productivity" as illustrated in FIG. 13. However, it is not necessary for the user to specify an operation policy as an attribute of the analysis target. In this case, it is assumed that there is no input regarding the operation policy in the processing of the index outputter 120. The method for accepting an input from the user regarding the operation policy is similar to that which is used in the usage domain described above. In response to the input operation of the user, the index outputter 120 stores a number indicating the selected operation policy and an input value indicating the selected operation policy as "1.0" into a predetermined region of the auxiliary storage 3. Regarding a facility device type that is not selected, the index outputter 120 may store a number indicating the operation policy and "0.0" as a value indicating that the operation policy is not selected.

It is necessary for the user to specify, as the attribute of the analysis target, at least one item from among the values indicating the usage domain, the facility device type, the installation environment, and the operation policy.

Next, a method on how the index outputter 120 illustrated in FIG. 2 integrates the degrees of importance of elements of the inputted attributes of the analysis target to obtain an index value. In the embodiment, the index outputter 120 obtains an index value by taking into account only the inputted attributes.

As described above, since the range of 0.0 to 1.0 is used for values to be inputted by the user, the index outputter 120 first multiplies the weighting constants associated with the elements of the attribute of the analysis target of the weighting table 111 by the input value and then adds up the values obtained by multiplication to obtain the index value. The index outputter 120 performs this calculation independently for the analysis speed, the analysis accuracy, and the analysis robustness, and obtains: (1) the index value regarding analysis speed, (2) the index value regarding analysis accuracy, and (3) the index value regarding analysis robustness. The index value, obtained by the index outputter 120 indicating the index for selection of the analysis procedure is provided to the pre-processing selector 150 and to the analysis procedure selector 170.

For example, in a case where the index value regarding analysis speed is the highest value among the three index values, this is indication that an analysis procedure ought to be selected from the perspective of giving the highest priority to making the analysis speed faster. Likewise, if the index value regarding analysis accuracy is the highest value among the three index values, this is indication that an analysis procedure ought to be selected from the perspective of giving the highest priority to making the analysis accuracy higher. Likewise, if the index value regarding analysis robustness is the highest value among the three index values, this is indication that an analysis procedure ought to be selected from the perspective of giving the highest priority to making the analysis robustness higher.

Next, a specific case is used to describe the processing for the calculations performed by the index outputter 120. Here, an example is described in which an industrial robot is set as the analysis target for detection of abnormalities in the industrial robot. It is assumed that the installation location of the industrial robot, which is the analysis target, is high temperature and that there is some sand in the environment. Therefore, it is assumed that the user selected "Industrial robot" on the selection screen of the facility device type such as that illustrated in FIG. 6, inputted "0.8" as the value indicating the degree of the selected "High temperature" and inputted "0.1" as the value indicating the degree of the selected "Sand" on the selection screen of the installation environment such as that illustrated in FIG. 5. In response to the operations of the user, the index outputter 120 temporarily stores the respective input values into the auxiliary storage 3.

First, the index outputter 120 obtains (1) the index value regarding analysis speed. The index outputter 120 stores, into a working area 001 of the auxiliary storage 3, a value "+7.0" obtained by multiplying (i) the input value "1.0" indicating that the "Industrial robot" is selected by (ii) the weighting constant "+7.0" regarding analysis speed of the "Industrial robot" acquired from the weighting table 112 of FIG. 3B. Since the "Laser machining machine" and the "Pump" are not selected, the respective input values are "0.0", and thus the above-described calculations are unnecessary.

The index outputter 120 stores, into a working area 002 of the auxiliary storage 3, a value "0.0" obtained by multiplying (i) the input value "0.8" inputted as the degree of "High temperature" by (ii) the weighting constant "0.0" regarding the analysis speed of "High temperature" acquired from the weighting table 113 of FIG. 3C.

The index outputter 120 stores, into a working area 003 of the auxiliary storage 3, a value "0.0" obtained by multiplying (i) the input value "0.1" inputted as the degree of "Sand" by (ii) the weighting constant "0.0" regarding the analysis speed of "Sand" acquired from the weighting table 113.

After the respective weighting constants regarding analysis speed are multiplied for all of the input values, the index outputter 120 adds up the values stored in the working areas 001 to 003. In the above-described example, the sum is "+7.0". This value is the index value regarding analysis speed in accordance with the attributes of the analysis target. As illustrated in FIG. 2, the index outputter 120 outputs this "+7.0" sum as the index value regarding analysis speed to the pre-processing selector 150 and to the analysis procedure selector 170.

Next, the index outputter 120 obtains (2) the index value regarding analysis accuracy. Before execution of the calculations described below, the working areas 001 to 003 of the auxiliary storage 3 are emptied.

The index outputter 120 stores, into the working area 001 of the auxiliary storage 3, a value "+2.0" obtained by multiplying (i) the input value "1.0" indicating that the "Industrial robot" is selected by (ii) the weighting constant "+2.0" regarding analysis accuracy of the "Industrial robot" acquired from the weighting table 112 of FIG. 3B.

The index outputter 120 stores, into the working area 002 of the auxiliary storage 3 a value "+0.8" obtained by multiplying (i) the input value "0.8" of the degree of "High temperature" by (ii) the weighting constant "+1.0" regarding analysis speed of "High temperature" acquired from the weighting table 113 of FIG. 3C.

The index outputter 120 stores, into the working area 003 of the auxiliary storage 3, a value "+0.1" obtained by multiplying the input value "0.1" of the degree of "Sand" by the weighting constant "+1.0" regarding analysis accuracy of "Sand" acquired from the weighting table 113.

Once the respective weighting constants regarding analysis accuracy are multiplied for all of the input values, the index outputter 120 adds up the values stored in the working areas 001 to 003. The sum is "+2.9". This value is the index value regarding analysis accuracy in accordance with the attributes of the analysis target. The index outputter 120 outputs this "+2.9" sum as the index value regarding analysis accuracy to the pre-processing selector 150 and to the analysis procedure selector 170.

Last, the index outputter 120 obtains (3) the index value regarding analysis robustness. Before execution of the calculations described below, the working areas 001 to 003 of the auxiliary storage 3 are emptied.

The index outputter 120 stores, into the working area 001 of the auxiliary storage 3, a value "+1.5" obtained by multiplying (i) the input value "1.0" indicating that the "Industrial robot" is selected by (ii) the weighting constant "1.5" regarding analysis robustness of the "Industrial robot" acquired from the weighting table 112 of FIG. 3B.

The index outputter 120 stores, into the working area 002 of the auxiliary storage 3, a value "1.6" obtained by multiplying (i) the input value "0.8" of the degree of "High temperature" by (ii) the weighting constant "+2.0" regarding analysis robustness of "High temperature" acquired from the weighting table 113 of FIG. 3C.

The index outputter 120 stores, into the working area 003 of the auxiliary storage 3, a value "+0.1" obtained by multiplying (i) the input value "0.1" of the degree of "Sand" by (ii) the weighting constant "+1.0" regarding analysis robustness of "Sand" acquired from the weighting table 113.

Once the respective weighting constants regarding analysis robustness are multiplied for all of the input values, the index outputter 120 adds up all of the values stored in the working areas 001 to 003. The sum is "+3.2". This value is the index value regarding analysis robustness in accordance with the attributes of the analysis target. The index outputter 120 outputs this "+3.2" sum as the index value regarding analysis robustness to the pre-processing selector 150 and to the analysis procedure selector 170.

The above is the method by which the index outputter 120 obtains the index value for selection of an analysis procedure of the diagnosis target data. In the above example, an example is described in which the user specifies the facility device type and the installation environment. The user can freely specify items among the four items: the usage domain, the facility device type, the installation environment, and the operation policy. For example, in the case where all of the items are specified, and in the case where only one of the four items is specified, the index outputter 120 performs processing in a manner similar to that described above.

The pre-processing table 130 illustrated in FIG. 2 stores information regarding the pre-processing to be used the pre-processor 160 as illustrated in FIG. 7. The pre-processing is processing that is performed on the data of the analysis target before the analysis processing is performed. This pre-processing includes processing for missing value interpolation, processing for outlier removal, and the like. The pre-processing table 130 has stored therein procedure names for each pre-processing as well an evaluation value of analysis speed and an evaluation value of analysis accuracy regarding each pre-processing.

The evaluation values of analysis speed are scores obtained by evaluating the fastness of the analysis processing for each pre-processing procedure stored in the pre-processing table 130 based on an identical standard. In the illustrated example, the greater the evaluation value, the faster the analysis speed. For example, the evaluation value of procedure 12 is "+9.5", whereas the evaluation value of procedure 13 is "+6.0". This is indication that fastness of analysis processing of procedure 12 is greater than that of procedure 13. Likewise, the evaluation values of analysis accuracy are scores obtained by evaluating the analysis accuracy for each pre-processing procedure stored in the pre-processing table 130 based on an identical standard. In the illustrated example, the higher the evaluation value, the higher the analysis accuracy.

Furthermore, the pre-processing table 130 includes paths, each of which indicates a region of the auxiliary storage 3 in which the pre-processing programs for execution of each pre-processing are stored.

The analysis procedure table 140 illustrated in FIG. 2 stores information regarding the analysis procedure to be executed by an analyzer 220 of a diagnosis processor 200 as illustrated in FIG. 8. The analysis procedure table 140 has stored therein, for each of the analysis procedures, a name of the analysis procedure, an evaluation value of analysis speed, an evaluation value of analysis accuracy, an evaluation value of analysis robustness.

The evaluation values of analysis speed are scores obtained by evaluating the fastness of the analysis processing for each analysis procedure stored in the analysis procedure table 140 based on an identical standard. In the illustrated example, the greater the value is, the faster the analysis speed. The evaluation values of analysis accuracy are scores obtained by evaluating analysis accuracy for each analysis procedure stored in the analysis procedure table 140 based on an identical standard. In the illustrated example, the greater the value is, the higher the analysis accuracy. The evaluation values of analysis robustness are scores obtained by evaluating analysis robustness for each analysis procedure stored in the analysis procedure table 140. In the illustrated example, the greater the evaluation value the lower the susceptibility to change caused by external disturbances.

Furthermore, the analysis procedure table 140 includes paths, each of which indicates a region of the auxiliary storage 3 in which the analysis procedure programs 34 for execution of each analysis procedure are stored.

The pre-processing selector 150 illustrated in FIG. 2 compares the index value regarding analysis speed to be outputted by the index outputter 120 with the evaluation value of analysis speed of the pre-processing table 130, compares the index value regarding analysis accuracy to be outputted by the index outputter 120 with the evaluation value of analysis accuracy of the pre-processing table 130, and selects a pre-processing procedure. The pre-processing selector 150 outputs the selected pre-processing procedure to the pre-processor 160 and the pre-processor 210. For example, the pre-processing selector 150 stores information indicating the selected pre-processing procedure into the auxiliary storage 3. The information indicating the pre-processing procedure stored in the auxiliary storage 3 is read by the pre-processor 160 and the pre-processor 210. By doing so, the pre-processing selector 150 provides the selected pre-processing procedure to the pre-processor 160 and to the pre-processor 210.

For example, in a case where the index value regarding analysis speed and the index value regarding analysis accuracy that are to be outputted by the index outputter 120 are "+7.0" and "+2.9", respectively, the pre-processing selector 150 selects a procedure of pre-processing based on the pre-processing table 130 as illustrated in FIG. 7 as follows. The pre-processing selector 150 selects, from the pre-processing table 130, a pre-processing having an evaluation value of analysis speed and an evaluation value of analysis accuracy that exceed the index value regarding analysis speed and the index value regarding analysis accuracy that are output by the index outputter 120. In the example illustrated in FIG. 7, both the evaluation value of analysis speed and the evaluation value of "Procedure 11" are greater than the respective index values output by the index outputter 120. Therefore, the pre-processing selector 150 outputs selected "Procedure 11" as the procedure of pre-processing to the pre-processor 160.

The pre-processor 160 performs pre-processing with respect to learning data by using the procedure of pre-processing selected by the pre-processing selector 150. The pre-processed learning data is provided to the analysis procedure selector 170.

The analysis procedure selector 170 performs a trial with respect to the learning data using a procedure selected from the analysis procedures of the analysis procedure table 140 and selects an analysis procedure to be used by the diagnosis processor 200 for diagnosis processing. The analysis procedure selector 170 outputs the selected analysis procedure to the aforementioned analyzer 220. For example, the analysis procedure selector 170 stores information indicating the selected analysis procedure into the auxiliary storage 3. The information indicating the analysis procedure stored in the auxiliary storage 3 is read by the analyzer 220. By doing so, the analysis procedure selector 170 provides the selected analysis procedure to the analyzer 220.

The analysis procedure selector 170 uses the learning data prior to the trial to obtain parameters, to be specified during analysis, for each of the analysis procedures stored in the analysis procedure table 140, and then stores information of the obtained parameters and the analysis procedure as pairs into the auxiliary storage 3. Even when the same procedure is used, multiple sets of parameters might be obtained. There are also procedures in which in which parameters are not necessary and procedures in which the parameters are self-evident.

The analysis procedure selector 170 selects an analysis procedure as follows. First, the analysis procedure selector 170 narrows down the analysis procedures to be used for trials from the analysis procedure table 140. Specifically, the analysis procedure selector 170 selects, from the analysis procedure table 140 illustrated in FIG. 8, analysis procedures that have evaluation values exceeding each of the index values to be outputted by the index outputter 120.

For example, in a case where the index value regarding analysis speed, the index value regarding analysis accuracy, and the index value regarding analysis robustness to be outputted by the index outputter 120 are "+7.0", "+2.9", and "+3.2", respectively, the analysis procedure selector 170 narrows down the analysis procedures as follows. In the example illustrated in FIG. 8, both the evaluation value of analysis speed, the evaluation value of analysis accuracy, and the evaluation value of analysis robustness of "Procedure 21" are all greater than the index values outputted by the index outputter 120. Furthermore, "Procedure 24" and "Procedure 26" also apply. Therefore, the analysis procedure selector 170 selects "Procedure 21", "Procedure 24", and "Procedure 26" to be used for trials.

Figure 9:
FIG. 9 is a diagram illustrating an example of data to be registered into a trial table.

Regarding the narrowed-down analysis procedures, the analysis procedure selector 170 reads the parameters of each of the procedures from the auxiliary storage 3, and creates a trial table 171 for storing trials, each of which is combination of parameters and a procedure of the narrowed-down analysis procedures. It is assumed, for example, that three sets of parameters of "Procedure 21", one set of parameters of "Procedure 24", and two sets of parameters of "Procedure 26" are stored in the auxiliary storage 3. FIG. 9 illustrates an example of the trial table 171 that the analysis procedure selector 170 creates in this case. In the example of FIG. 9, the trials 51 to 53 are combinations of three sets of parameters and "Procedure 21". The trial 54 is a combination of one sec of parameters and "Procedure 24". Trials 55 and 56 are two sets of parameters and "Procedure 26".

Next, the analysis procedure selector 170 performs processing with respect to the learning data pre-processed by the pre-processor 160 using each of trials in the trial table 171. The analysis procedure selector 170 performs processing the pre-processed learning data using "Trial 51". The analysis procedure selector 170 stores analysis speed, analysis accuracy, and the like, as the trial results by "Procedure 51", into the auxiliary storage 3. The analysis procedure selector 170 performs similar processing for trials 52 to 56 as well.

After doing so, the analysis procedure selector 170 selects the most suitable procedure based on the trial results of trials 51 to 56. It is assumed for example that the index value regarding analysis speed, the index value regarding analysis accuracy, and the index value regarding analysis robustness that are to be outputted by the index outputter 120 are "+7.0", "+2.9", and "+3.2", respectively. In this case, the analysis procedure selector 170 makes a determination that the property having the greatest value is to be prioritized. Here, the analysis procedure selector 170 selects, from trials 51 to 56, a trial with the fastest analysis time, and stores the parameters and the analysis procedure of the selected trial into the auxiliary storage 3.

There may be a case where the analysis procedures get narrowed down to a single analysis procedure when the analysis procedure selector 170 narrows down the analysis procedures of the analysis procedure table 140 by comparing the index values to be outputted by the index outputter 120 with the evaluation values of the analysis procedure table 140. In this case, when the narrowed-down analysis procedure is a procedure that does not require a parameter or the parameter is one set, the trial is narrowed down to one. Therefore, the analysis procedure selector 170 may select the analysis procedure of the trial that applies without performing any trial with respect to the learning data.

The user instruction reflector 180 illustrated in FIG. 2 causes the analysis procedure selector 170 to reselect an analysis procedure in accordance with an instruction of the user. The user views the analysis results by the diagnosis processor 200, which is described further below, and gives a user instruction such as "Increase analysis accuracy" or "Increase analysis speed". The user instruction reflector 180 updates the weighting constants of the weighting table 110 in accordance with the instruction of the user, uses the updated weighting constants to reobtain an index value regarding analysis speed, and outputs the obtained index value to the analysis procedure selector 170. By doing so, the user instruction reflector 180 selects an analysis procedure that that meets the needs of the user.

When the updated index value provided by the user instruction reflector 180, the analysis procedure selector 170 re-performs the aforementioned processing, and selects an analysis procedure. Specifically, the analysis procedure selector 170 narrows down the analysis procedures stored in the analysis procedure table 140 and creates the trial table 171 containing trials, each of which is a combination of parameters and a procedure of the narrowed-down analysis procedures. Next, the analysis procedure selector 170 performs processing the learning data pre-processed by the pre-processor 160 for each of the trials of the trial table 171, and selects the most suitable procedure based on the trial results including analysis speed, analysis accuracy, and the like of each of the trials.

As described above, the user instruction reflector 180 may perform reflection of the instruction of the user after analysis is performed by the diagnosis processor 200. Alternatively, the user instruction reflector 180 may cause the instruction of the user to be reflected before analysis is performed by the diagnosis processor 200. For example, when the analysis procedure and the parameters of the trial selected by the analysis procedure selector 170 are stored into the auxiliary storage 3, the user instruction reflector 180 presents the results of the selection to the user, and prompts the user to determine whether or not to reselect a procedure. For example, the user instruction reflector 180 presents a screen, such as that in FIG. 10, on the display of the display unit 5, and prompts the user to determine whether or not to perform a reselection. Here, the element of the attribute of the analysis target input by the user, the index value output by the index outputter 120, and the parameters and the analysis procedure of the selected trial are displayed.

After the user changes the index value and selects "Reselect", the user instruction reflector 180 outputs the instruction of the reselection of the analysis procedure and the changed index value that is inputted by the user to the analysis procedure selector 170. In response to this, the analysis procedure selector 170 uses the changed index value to reselect an analysis procedure.

Alternatively, the user instruction reflector 180 may cause instructions made before and after the analysis, performed by the diagnosis processor 200, to be reflected.

The diagnosis processor 200 performs analysis processing on diagnosis target data by using the analysis procedure selected by the analysis procedure selector 170 of the learning processor 100. As previously described, the diagnosis target data is (i) data collected from sensors provided on various apparatuses that are under operation and analysis targets and (ii) stored in the auxiliary storage 3 in advance.

The diagnosis processor 200 includes the pre-processor 210 and the analyzer 220. The individual components of the diagnosis processor 200 are accomplished by execution, by the processor 1, of the diagnosis processing program 32 to be stored in the auxiliary storage 3. The analyzer 220 is an example of the analyzing means of the present disclosure.

The pre-processor 210 performs pre-processing on the diagnosis target data by using the procedure of pre-processing selected by the pre-processing selector 150. The pre-processed diagnosis target data is provided to the analyzer 220.

The analyzer 220 performs analysis processing on the pre-processed diagnosis target data by using the parameters and analysis procedure selected by the analysis procedure selector 170.

The learning processing and the diagnosis processing according to analysis by the data analysis device 1000 that includes the aforementioned configuration are described. First, the learning processing of the learning processor 100 is described with reference to FIG. 11. The learning processing is executed, for example, when operation of the analysis target starts or when there is a change regarding an attribute of the analysis target.

First, the user issues an instruction to launch the learning processing program 31 of the data analysis device 1000 by operating the keyboard, mouse, and/or the like of the inputter 4. In response to the operation of the user, the processor 1 executes the learning processing program 31 of the auxiliary storage 3.

Figure 11:
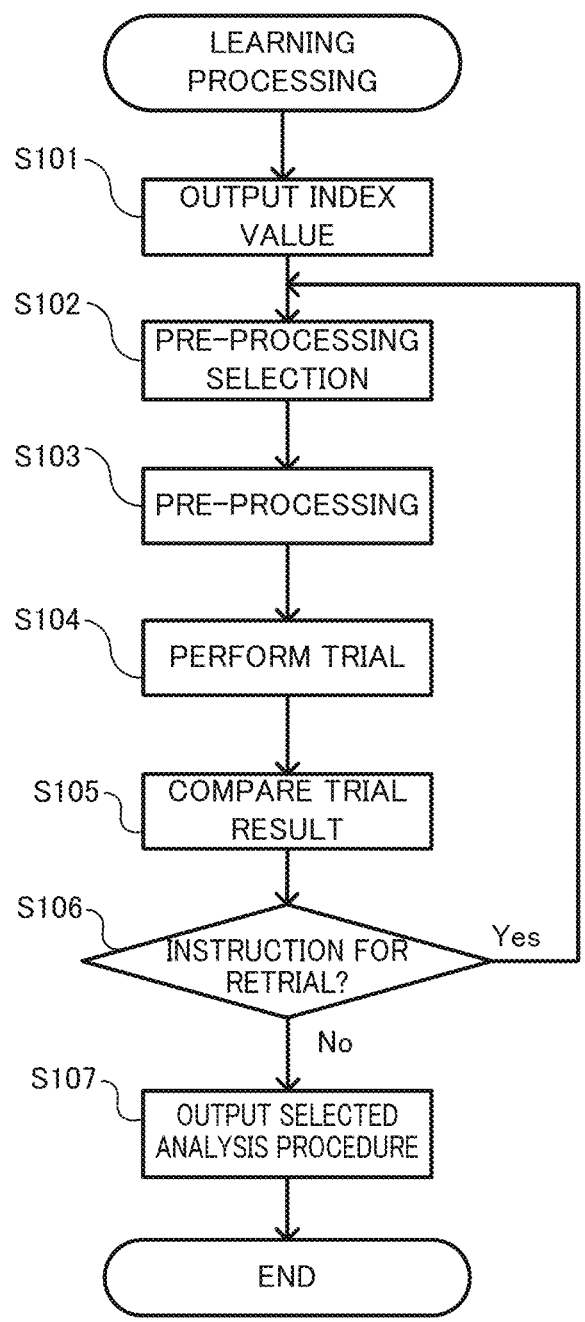
FIG. 11 is a flowchart of learning processing.
Figure 12:
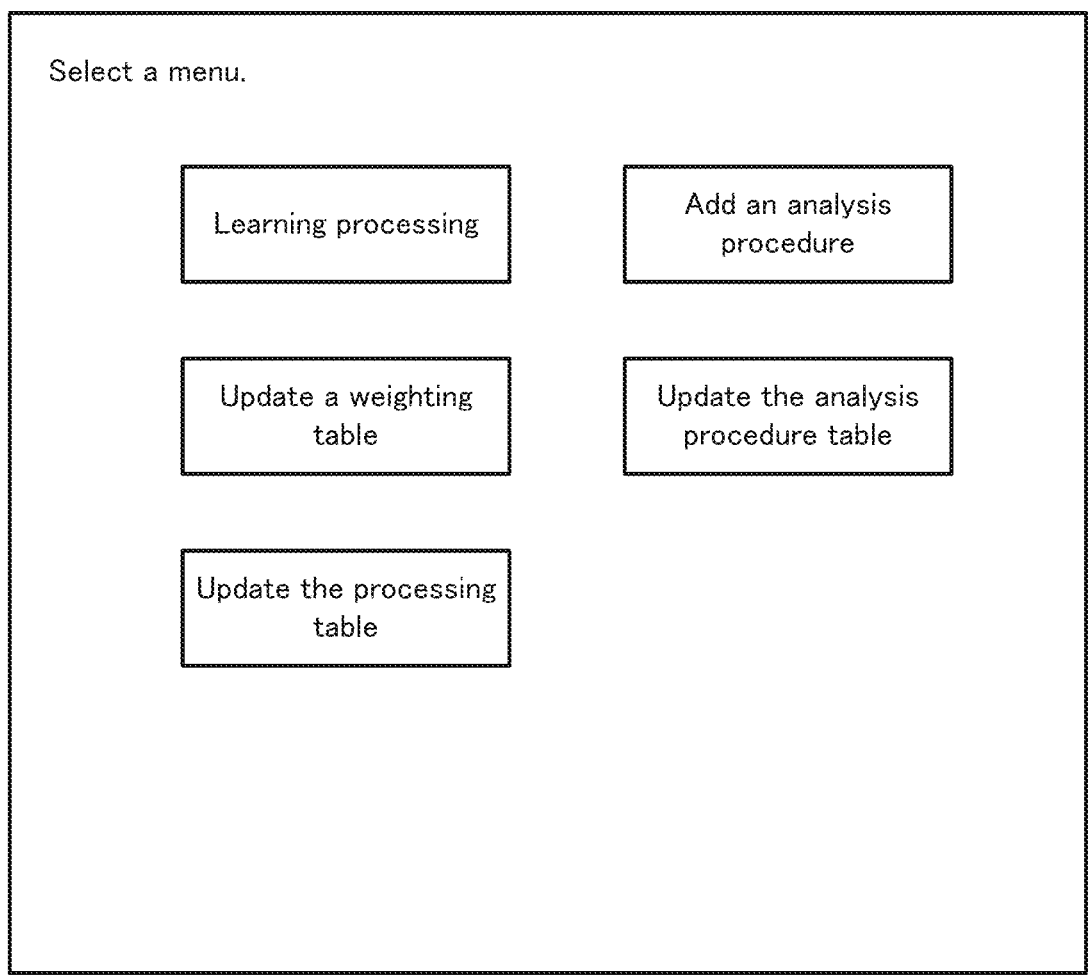
FIG. 12 is a diagram illustrating an example of a menu screen.

The processor 1 displays a menu screen such as that illustrated in FIG. 12 onto the display of the display unit 5. For example, when the user selects the "Learning processing" menu, the processor 1 outputs an index value for selection of an analysis procedure from elements of attributes to be inputted by the user in the order previously-described regarding the index outputter 120 as illustrated in FIG. 11. (step S101). The processor 1 functions as the index outputter 120 by executing this processing.

The processor 1 causes a selection screen of usage domains such as that illustrated in FIG. 4 to be displayed on the display unit 5, as an input screen of elements of attributes of the analysis target. After the user freely specifies a usage domain and selects "Enter", the processor 1 stores a number indicating usage domain specified by the user into a predetermined region of the auxiliary storage 3. In a case where the user selects "Keep usage domain unspecified", information indicating this choice regarding the usage domain is stored into a predetermined region of the auxiliary storage 3.

For the installation environment, the facility device type, and the operation policy as well, the processor 1 sequentially displays the respective input screens such as those illustrated in FIGS. 5, 6, and 13 onto the display unit 5, and stores the inputted values as elements of the attributes into the auxiliary storage 3.

Next, the processor 1 displays a confirmation screen such as that illustrated in FIG. 14. When the user selects "Reflect", the processor 1 multiplies the input values inputted as elements of the attributes of the analysis target inputted by the weighing constants of the weighting table 110, calculates the index value of analysis speed, the index value of analysis accuracy, the index value of analysis robustness, and stores the calculated index values into the auxiliary storage 3.

Next, as illustrated in FIG. 11, the processor 1 selects a pre-processing using in the order previously-described regarding the pre-processing selector 150 (step S102). The processor 1 functions as the pre-processing selector 150 by executing this processing. Specifically, the processor 1 compares the index values stored into the auxiliary storage 3 in step S101 with the evaluation values of the pre-processing table 130, selects a pre-processing procedure, and stores the selected pre-processing procedure into the auxiliary storage 3.

Next, the processor 1 performs pre-processing in the order previously-described regarding the pre-processor 160 (step S103). The processor 1 functions as the pre-processor 160 by executing this processing. Specifically, the processor 1 performs pre-processing with respect to the learning data in the order previously-describe regarding the pre-processor 160 by using the pre-processing procedure selected in step S102, and stores the pre-processed learning data into the auxiliary storage 3.

Furthermore, the processor 1 obtains the parameters of each of the analysis procedures stored in the analysis procedure table 140, and stores of the obtained parameters and the analysis procedure as pairs into the auxiliary storage 3.

Next, the processor 1 performs a trial on the analysis procedure (step S104). The processor 1 functions as the analysis procedure selector 170 by executing the processing of step S104 to step S107 in the order previously-described regarding the analysis procedure selector 170.

First, the processor 1 reads the index value of analysis speed, the index value of analysis accuracy, and the index value of analysis robustness obtained in step S101 from the auxiliary storage 3. The processor 1 selects, from among the analysis procedures of the analysis procedure table 140, any analysis procedure whose evaluation value of analysis speed, evaluation value of analysis accuracy, and evaluation value analysis robustness exceed the index value of analysis speed, the index value of analysis accuracy, and the index value of analysis robustness, respectively. The processor 1 stores, into the trial table 171 illustrated in FIG. 9, trials, each of which is a combination of a parameter of parameters obtained in step S103 and a procedure of the procedures narrowed down in this manner.

The processor 1 performs processing by each of the trials in the trial table 171 with respect to the learning data pre-processed in step S103, and stores analysis speed, analysis accuracy, and the like as trial results for the individual trials into the auxiliary storage 3.

As illustrated in FIG. 11, the processor 1 thereafter compares the trial results (step S105). The processor 1 makes a determination that the property having the greatest value, among the index value regarding analysis speed, the index value regarding analysis accuracy, and the index value regarding analysis robustness obtained in step S101, is to be prioritized, and selects one trial from the trial table 171 based on the trial results.

The processor 1 displays the parameter and the analysis procedure of the selected trial as well as a screen such as that illustrated in FIG. 10 onto the display of the display unit 5, and accepts an instruction of the user as to whether or not to perform a retrial (step S106). If the user issues an instruction for a retrial (YES in step S106), the processor 1 performs a retrial of the processing for step S102 and the subsequent steps.

If the user does not issue a user instruction for a retrial (NO in step S106), the processor 1 outputs the selected analysis procedure (step S107). Specifically, the processor 1 stores the analysis procedure and parameter of the selected trial into the auxiliary storage 3. This is learning processing of the learning processor 100. In the flow illustrated in FIG. 11, although an example is described in which an instruction of the user causes the selection of the analysis procedure to be reflected before diagnosis processing of the diagnosis processor 200, in a case where an instruction of the user is reflected into the selection of the analysis procedure after the user is presented with the analysis results of the diagnosis processor 200, step S106 may be omitted.

Next, diagnosis processing in the diagnosis processor 200 illustrated in FIG. 2 is described. Since the diagnosis target data is provided to the diagnosis processor 200 in real-time from the analysis target in operation, the diagnosis processor 200 continuously performs diagnosis processing while the facility device that is the analysis target is in running.

First, the user issues an instruction to launch the diagnosis program 32 of the data analysis device 1000 by operating the keyboard, mouse, and/or the like of the inputter 4. In response to the operation of the user, the processor 1 executes the diagnosis processing program 32 of the auxiliary storage 3. The learning processing is executed before execution of the diagnosis processing and information necessary for diagnosis processing is stored in the auxiliary storage 3.

Figure 15:
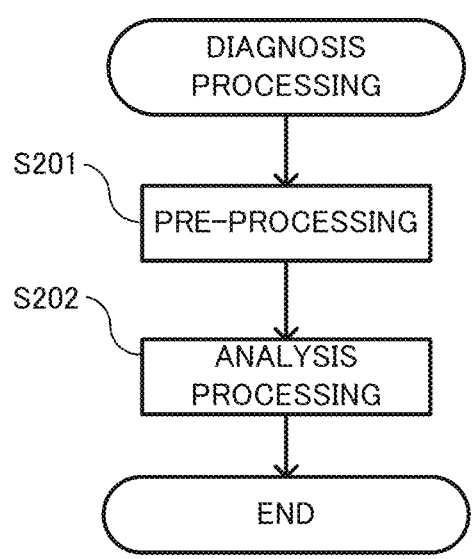
FIG. 15 is a flowchart of diagnosis processing.

As illustrated in FIG. 15, the processor 1 executes pre-processing (step S201). The processor 1 functions as the pre-processor 160 by executing this processing. Specifically, the processor 1 reads, from the auxiliary storage 3, the pre-processing procedure selected by the pre-processing selector 150, and performs pre-processing on the diagnosis target data by using this pre-processing procedure. The processor 1 stores the pre-processed diagnosis target data into the auxiliary storage 3.

Next, the processor 1 executes analysis processing (step S202). The processor 1 functions as the analyzer 220 by executing this processing. Specifically, the processor 1 performs analysis processing on the diagnosis target data pre-processed in step S201 by using the analysis procedure and parameter selected by the analysis procedure selector 170 from the auxiliary storage 3. This is the diagnosis processing of the diagnosis processor 200.

As described above, the data analysis device 1000 obtains the index value for selecting an analysis procedure based on elements of attributes of the analysis target inputted and selects an analysis procedure in which the evaluation value of the property of the data analysis satisfies a condition set in connection with the index value. With such a configuration, an analysis procedure that is suited for the attributes of the analysis target can be selected.

Furthermore, since it is sufficient as long as the user inputs the elements of the attributes of the analysis target, the user can select a suitable analysis procedure with use of the data analysis device 1000 even if the user does not possess specialized knowledge regarding analysis procedures and the target of the analysis.

Also, by performing trials with respect to the learning data and selecting an analysis procedure in which the values of each property of the trial results satisfy a condition set in connection with index values, an even more suitable analysis procedure can be selected based on the actual trial results.

By selecting a pre-processing procedure in which a condition set in connection with the index value obtained based on elements of attributes of the analysis target inputted, a pre-processing method suited for the attributes of the analysis target can be selected.

Modified Example 1

When an index value is to be obtained, an additional weight may be assigned to a weighting coefficient of a table, among the weighting tables 111 to 114 illustrated in FIGS. 3A to 3D, regarding an attribute on which placing greater importance is preferred. For example, in a case where it is preferable to place greater importance on the usage domain, a predetermined coefficient may be multiplied by a weighting constant of the weighting table 111 regarding the usage domain, and then the total sum for each property may be calculated.

Modified Example 2

Figure 16:
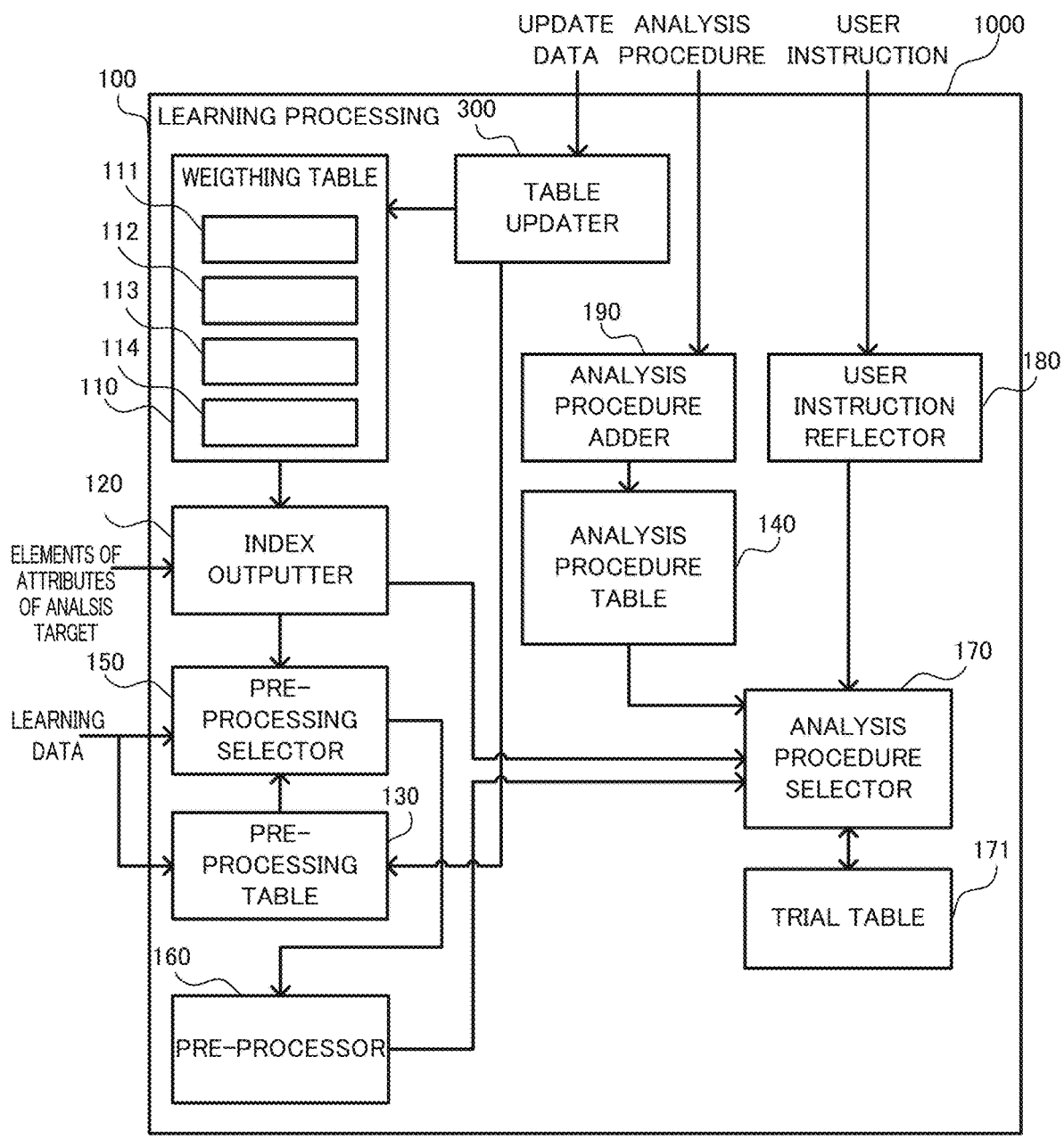
FIG. 16 is a functional block diagram of a learning processor according to a Modified Example 2.

As illustrated in FIG. 16, the learning processor 100 may also include an analysis procedure adder 190 that newly adds analysis procedures. The analysis procedure adder 190 registers a new analysis procedure into the analysis procedure table 140 in accordance with an instruction of the user. The analysis procedure adder 190 is an example of the analysis procedure addition means of the present disclosure.

The analysis procedure adder 190 is accomplished by the processor 1 operating as described below. When the user selects the "Add an analysis procedure" menu on the menu screen illustrated in FIG. 12, the processor 1 causes a screen, for adding an analysis procedure, such as that illustrated in FIG. 17 to be displayed onto the display unit 5. On the adding screen, when the user performs an input regarding the analysis procedure to be added and presses "Register", the processor 1 adds information of the analysis procedure to the analysis procedure table 140. Furthermore, the processor 1 stores an analysis procedure program 34 of the new analysis procedure into the auxiliary storage 3.

Furthermore, as illustrated in FIG. 16, the learning processor 100 may also include a table updater 300 that updates each of the values of the weighting constants in the weighting table 110. The table updater 300 uses the update data indicated by the instruction of the user to update the values of the weighting constants of the weighting table 110. The table updater 300 is an example of the table updating means of the present disclosure.

The table updater 300 is accomplished by the processor 1 operating as described below. When the user selects the "Update a weighting table" on the menu screen illustrated in FIG. 12, the processor 1 causes a screen, for updating a table, such as that illustrated in FIG. 18 to be displayed onto the display unit 5. On the updating screen, when the user freely changes a weighting constant and selects "Register", the processor 1 uses the inputted information to update a value of the weighting constant of the weighting table 111 regarding usage domains. In FIG. 18, although an updating screen of the weighting table 111 regarding usage domains is illustrated as an example of an updating screen, this updating can also be performed from similar screens of the weighting table 112 regarding facility device types, the weighting table 113 regarding installation environments, and the weighting table 114 regarding operation policies.

For example, the user can update the values of weighting constants of each of the weighting tables 110 by using the pre-processing results of the pre-processor 210 of the diagnosis processor 200, the pre-processing results of the pre-processor 160 of the learning processor 100, or the results of both.

Furthermore, the table updater 300 may update the evaluation value of analysis speed or the evaluation value of analysis accuracy of the pre-processing table 130. The table updater 300 uses the update data indicated by the instruction of the user to update the evaluation values of the pre-processing table 130 and the evaluation values of the analysis procedure table 140.

For example, the user can update each of the evaluation values of the pre-processing table 130 by using the pre-processing results of the pre-processor 210 of the diagnosis processor 200, the pre-processing results of the pre-processor 160 of the learning processor 100, or both. Likewise, the user can also update each of the evaluation values of the analysis procedure table 140.

In the embodiment, an example is described in which the index value is obtained by multiplying each value inputted as an element of an attribute of the analysis target by a corresponding weighting constant, and then adding together all of the values obtained by multiplication. However, the method for obtaining an index value is not limited to this. For example, an index value may be obtained by multiplying each element of an attribute of the analysis target by a corresponding weighting constant and then multiplying together all of these values acquired by multiplication.

In the embodiment, when narrowing down the analysis procedures to be used for trials from the analysis procedure table 140, analysis procedures having evaluation values that exceed each of the index values to be inputted by the index outputter 120 are selected from the analysis procedure table 140. This is because the index value is a value that increases in proportion to the height in the degree of importance. However, the manner in which narrowing down is determined by the analysis procedure selector 170 is not limited to this. For example, in a case where the index value is inversely proportional to the height in the degree of importance, analysis procedures having evaluation values lower than the index values will be selected. Also, the condition of the index value exceeding or being less than the evaluation value is not always necessary. The analysis procedure selector 170 may instead use a condition of the evaluation value being close to the index value. In such a case, it is sufficient for the analysis procedure selector 170 to make a determination as to whether or not the difference between the evaluation value and the index value is a predetermined value.

Also, in the embodiment, analysis procedures having evaluation values exceeding all of the index values to be outputted by the index outputter 120 are selected from the analysis procedure table 140, this is not limiting. For example, it can be set such that analysis procedures having evaluations values exceed two index values are selected from the analysis procedure table 140. Alternatively, it can be set such that an average value of the index values of the properties to be outputted by the index outputter 120 and an average value of the evaluation values regarding the properties of the analysis procedure are to be used for selecting, from the analysis procedure table 140, analysis procedures having an average evaluation value of the evaluation values that either exceeds or is less than the average value of the index values.

In the above-described example, although the analysis procedure selector 170 determines that a property having the largest index value is to be prioritized, this is not limiting. For example, the analysis procedure selector 170 may be set to select an analysis procedure placing importance on both analysis speed and analysis robustness in a case where the index value regarding analysis speed, the index value regarding analysis accuracy, and the index value regarding analysis robustness that are to be outputted by the index outputter 120 are "+7.0", "+2.9", and "+5.2", respectively.

In the embodiment, a selection procedure of an analysis procedure is selected based on elements of attributes of the analysis target, the attributes including the usage domain of the analysis target, the facility device of the analysis target, installation environment of the facility device, and the operation policy of the facility device operator. However, attributes of the analysis target to be inputted into the index outputter 120 are not limited to these attributes. For example, information of a component mounted on the facility device may be imported into the index outputter 120, as an attribute of the analysis target.

In the embodiment, although the index outputter 120 outputted an index value regarding analysis speed, an index value regarding analysis accuracy, and an index value regarding analysis robustness, the outputs by the index outputter 120 are not limited to these. The index outputter 120 may output one or more than one index value among an index value regarding analysis speed with respect to an increase in the number of dimensions, an index value regarding analysis speed with respect to an increase in data, an index value regarding analysis robustness with respect to monotonic conversion of inputs, and an index value regarding explainability. In such as case, it is necessary to add, to the weighting table 110, the weighting constants corresponding to the index values to be outputted, and register into, the pre-processing table 130 and the analysis procedure table 140, evaluation values corresponding to the index values to be outputted.

In the embodiment, an example is described in which properties of data analysis are represented by analysis speed indicating a fastness of analysis processing, analysis accuracy indicating how close an analysis-based result is to a true value, and analysis robustness indicating resistance to change caused by external disturbances. However, the properties of data analysis may be expressed not by these three, but by, for example, analysis speed and analysis accuracy. As one alternative, the property of data analysis may be expressed by only analysis speed. As another alternative, the properties of data analysis may be expressed by only analysis accuracy. As yet another alternative, other properties in addition to the aforementioned analysis speed, analysis accuracy, and analysis robustness may be added as properties of analyzing data.

In the embodiment, an example is described in which the learning processor 100 and the diagnosis processor 200 are included in the same data analysis device 1000. However, the learning processor 100 and the diagnosis processor 200 may be provided in physically different devices.

In the embodiment, although an example is described in which diagnosis target data collected from the apparatuses 601 and 602 is used, data collected in advance by another computer from the apparatus 601 and 602 and stored in the memory of the other computer together with the acquisition data and time may be used as the diagnosis target data and the learning data. In this case, it is sufficient as long as the data analysis device 1000 and the other computer are connected via a communication cable and the data is uploaded from the memory of the other computer to the auxiliary storage 3 of the data analysis device 1000.

As the recording medium on which the program to be executed by the data analysis device 1000 is recorded, useable examples include a computer-readable recording medium such as a flexible disk, a compact disc read-only memory (CD-ROM), a digital versatile disc (DVD), and a magneto-optical disc (MO).

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

REFERENCE SIGNS LIST

001, 002, 003 Working area
1 Processor
2 Main storage
3 Auxiliary storage
4 Inputter
5 Display unit
9 Bus
31 Learning processing program
32 Diagnosis processing program
33 Pre-processing program
34 Analysis procedure program
51 to 56 Trial
100 Learning processor
110, 111 to 114 Weighting table
120 Index outputter
130 Pre-processing table
140 Analysis procedure table
150 Pre-processing selector
160, 210 Pre-processor
170 Analysis procedure selector
171 Trial table
180 User instruction reflector
190 Analysis procedure adder
200 Diagnosis processor
220 Analyzer
300 Table updater
1000 Data analysis device

The invention claimed is:

1. A learning processing device configured to receive diagnosis target data to be analyzed from an analysis target device, the learning processing device comprising:
   an index outputter to output an index for selection of an analysis procedure based on attributes to be inputted of the analysis target device, the attributes including features of the analysis target device and features of an environment surrounding the analysis target device; and
   an analysis procedure selector to select the analysis procedure among analysis procedures as an analysis procedure for which the diagnosis target data to be outputted by the analysis target device is to be analyzed, the selected analysis procedure being a procedure in which an evaluation value of a property of data analysis satisfies a preset condition in connection with the index.

2. The learning processing device according to claim 1, wherein the index outputter to output an index value indicating the index for selection of an analysis procedure by integrating degrees of importance of properties of the data analysis pre-defined in elements indicating the attributes of the analysis target device for each property of the data analysis.

3. The learning processing device according to claim 2, wherein regarding properties of the data analysis that are the same, the degrees of importance are pre-defined in the elements.

4. The learning processing device according to claim 2, wherein regarding elements of attributes of the analysis target device inputted, the index outputter obtains an index value for each property of the data analysis by calculating, for each property of the data analysis, a total sum of the degrees of importance pre-defined in the elements.

5. The learning processing device according to claim 2, wherein regarding elements of attributes of the analysis target device inputted, the index outputter obtains an index value for each property of the data analysis by assigning pre-defined weightings to the degrees of importance pre-defined in the elements and calculating a total sum of the weighted degrees of importance for each property of the data analysis.

6. The learning processing device according to claim 2, wherein the analysis procedure selector performs a trial based one analysis procedure with respect to learning data or performs trials based on multiple analysis procedures with respect to the learning data, and then selects an analysis procedure in which the evaluation value in results of the trial satisfies a preset condition in connection with the index value.

7. The learning processing device according to claim 6, further comprising:
   an analysis procedure table to store analysis procedures targeted for selection and evaluation values, each of which is associated an analysis procedure of the analysis procedures targeted for selection,
   wherein the analysis procedure selector selects an analysis procedure in which an evaluation value of the analysis procedure table satisfies a preset condition in connection with the index value, and uses the selected analysis procedure to perform a trial with respect to the learning data.

8. The learning processing device according to claim 7, further comprising a pre-processing selector to select a pre-processing procedure to be performed with respect to the learning data before the analysis procedure selector performs the trial with respect to the learning data.

9. The learning processing device according to claim 8, wherein the pre-processing selector selects a pre-processing procedure to be performed with respect to the diagnosis target data before analysis processing in which the diagnosis target data is analyzed by using an analysis procedure selected by the analysis procedure selector.

10. The learning processing device according to claim 7, further comprising an analysis procedure adder to add an analysis procedure to the analysis procedure table in accordance with an instruction of a user.

11. The learning processing device according to claim 7, further comprising:
   a weighting table having stored therein weighting constants indicating degrees of importance pre-defined in each of the elements,
   wherein the index outputter assigns weightings, using the weighting constants, to values inputted as the elements, and obtains the index value for each property by calculating a total sum of the weighted values.

12. The learning processing device according to claim 11, further comprising a table updater to update the weighting constants of the weighting table and update the evaluation values of the analysis procedure table in accordance with the instruction of the user.

13. The learning processing device according to claim 2, further comprising a user instruction reflector to reflect a value of the index value outputted by the index outputter in accordance with an instruction of a user.

14. The learning processing device according to claim 1, wherein properties of the data analysis are represented at least by analysis speed indicating fastness of analysis processing and analysis accuracy indicating how close an analysis-based result is to a true value.

15. A data analysis device comprising:
   the learning processing device according to claim 1; and
   an analyzer to analyze the diagnosis target data by using the analysis procedure selected by the analysis procedure selector for the diagnosis target data.

16. An analysis procedure selection method to be executed by a computer and configured to receive diagnosis target data to be analyzed form an analysis target device, the analysis procedure selection method comprising:
   an input accepting step of accepting, from a user, an input of attributes of the analysis target device, the attributes including features of the analysis target device and features of an environment surrounding the analysis target device;
   an index outputting step of outputting an index for selection of an analysis procedure based on the attributes of the analysis target device inputted; and
   an analysis procedure selection step of selecting the analysis procedure among analysis procedures as an analysis procedure for which the diagnosis target data to be outputted by the analysis target device is to be analyzed, the selected analysis procedure being a procedure in which an evaluation value of a property of data analysis satisfies a preset condition in connection with the index.

17. A non-transitory computer-readable recording medium storing an analysis procedure selection program causing a computer to:
   receive diagnosis target data to be analyzed from an analysis target device;
   display, onto a display device, a screen for a user to input attributes of the analysis target device, the attributes including features of the analysis target device and features of an environment surrounding the analysis target device;
   output an index for selection of an analysis procedure based on the attributes of the analysis target device inputted; and
   select an analysis procedure among analysis procedures as an analysis procedure for which the diagnosis target data to be outputted by the analysis target device is to be analyzed, the selected analysis procedure being a procedure in which an evaluation value of a property of data analysis satisfies a preset condition in connection with the index.

\* \* \* \* \*